(12) United States Patent
Nashiki et al.

(10) Patent No.: US 8,673,429 B2
(45) Date of Patent: Mar. 18, 2014

(54) TRANSPARENT CONDUCTIVE FILM, TRANSPARENT CONDUCTIVE LAMINATE, TOUCH PANEL, AND METHOD FOR PRODUCING TRANSPARENT CONDUCTIVE FILM

(75) Inventors: Tomotake Nashiki, Ibaraki (JP); Kazuhiro Nakajima, Ibaraki (JP); Hideo Sugawara, Ibaraki (JP)

(73) Assignee: Nitto Denko Corporation, Ibaraki-shi, Osaka (JP)

( * ) Notice: Subject to any disclaimer, the term of this patent is extended or adjusted under 35 U.S.C. 154(b) by 874 days.

(21) Appl. No.: 12/502,373

(22) Filed: Jul. 14, 2009

(65) Prior Publication Data

US 2010/0013784 A1 Jan. 21, 2010

(30) Foreign Application Priority Data

Jul. 16, 2008 (JP) .................. 2008-185156

(51) Int. Cl.
*B32B 3/00* (2006.01)

(52) U.S. Cl.
USPC ........ 428/195.1; 428/212; 428/213; 428/215; 315/173; 315/174

(58) Field of Classification Search
USPC ........ 428/195.1, 212, 213, 215; 345/173, 174
See application file for complete search history.

(56) References Cited

U.S. PATENT DOCUMENTS

| 5,677,240 A | 10/1997 | Murakami et al. |
| 5,808,315 A | 9/1998 | Murakami et al. |
| 6,555,235 B1 * | 4/2003 | Aufderheide et al. ........ 428/447 |
| 7,914,883 B2 * | 3/2011 | Noguchi et al. ............. 428/220 |
| 2001/0028217 A1 | 10/2001 | Kataoka et al. |
| 2006/0290409 A1 * | 12/2006 | Noguchi et al. ............. 327/517 |
| 2007/0236618 A1 | 10/2007 | Maag et al. |
| 2008/0138589 A1 | 6/2008 | Wakabayashi et al. |
| 2008/0143683 A1 * | 6/2008 | Hotelling ..................... 345/173 |

FOREIGN PATENT DOCUMENTS

| JP | 6-088973 A | 3/1994 |
| JP | 11-064602 A | 3/1999 |
| JP | 2000-265259 A | 9/2000 |
| JP | 2001-345023 A | 12/2001 |

(Continued)

OTHER PUBLICATIONS

Machine translation of JP 2003-173238 acquired on Jun. 28, 2012.*
"Physical and Optical Properties of Minerals" in CRC Handbook of Chemistry and Physics, 92nd Ed., 2011, p. 4-141 to 4-142.*
Japanese Office Action dated Jul. 26, 2011, issued in corresponding Japanese Patent Application No. 2008-185156.

(Continued)

*Primary Examiner* — Gerard Higgins
(74) *Attorney, Agent, or Firm* — Westerman, Hattori, Daniels & Adrian, LLP

(57) ABSTRACT

The transparent conductive film of the present invention is a transparent conductive film, comprising a transparent film substrate, and a first transparent dielectric layer, a second transparent dielectric layer and a transparent conductive layer that are formed on one or both sides of the transparent film substrate in this order from the transparent film substrate side, wherein the transparent conductive layer is patterned, the relation $n2<n3<n1$ is satisfied, wherein $n1$ is the refractive index of the first transparent dielectric layer, $n2$ is the refractive index of the second transparent dielectric layer, and $n3$ is the refractive index of the transparent conductive layer, the first transparent dielectric layer has a thickness of from 2 nm to less than 10 nm, the second transparent dielectric layer has a thickness of from 20 nm to 55 nm, and the transparent conductive layer has a thickness of from 15 nm to 30 nm.

19 Claims, 5 Drawing Sheets

(56) References Cited

FOREIGN PATENT DOCUMENTS

| | | | |
|---|---|---|---|
| JP | 2003-136625 A | | 5/2003 |
| JP | 2003173238 A | * | 6/2003 |
| JP | 2004-152727 A | | 5/2004 |
| JP | 2004-339729 A | | 12/2004 |
| JP | 2005-341627 A | | 12/2005 |
| JP | 2006-173262 A | | 6/2006 |
| JP | 2008-098169 A | | 4/2008 |
| WO | WO 2006126604 A1 | * | 11/2006 |

OTHER PUBLICATIONS

Taiwanese Office Action dated Jun. 19, 2012, issued in corresponding Taiwanese Patent Application No. 098123494, w/ English translation.

Korean Office Action dated Aug. 13, 2012, issued in corresponding Korean Patent Application No. 2009-0062162, with English translation (8 pages).

Decision of the Taiwan Intellectual Property Office dated Jan. 15, 2013, issued in corresponding Taiwanese Patent Application No. 098123494, with English translation (7 pages).

* cited by examiner

TRANSPARENT CONDUCTIVE FILM, TRANSPARENT CONDUCTIVE LAMINATE, TOUCH PANEL, AND METHOD FOR PRODUCING TRANSPARENT CONDUCTIVE FILM

BACKGROUND OF THE INVENTION

1. Field of the Invention

The invention relates to a transparent conductive film, a transparent conductive laminate therewith, a touch panel therewith, and a method for producing a transparent conductive film.

2. Description of the Related Art

Concerning conventional transparent conductive components, the so-called conductive glass is well known, which includes a glass member and an indium oxide thin film formed thereon. Since the base member of the conductive glass is made of glass, however, it has low flexibility or workability and cannot preferably be used in some applications. In recent years, therefore, transparent conductive films using various types of plastic films such as polyethylene terephthalate films as their substrates have been used, because of their advantages such as good impact resistance and light weight as well as flexibility and workability.

A known transparent conductive film for detecting input positions includes a transparent conductive layer having a predetermined pattern. However, such a patterned transparent conductive layer may produce a clear difference between the patterned portion and the non-patterned portion (pattern opening portion) so that a display device produced therewith may have a poor appearance. Particularly concerning capacitive touch panels having a patterned transparent conductive layer over the surface of the display unit, there has been a demand for a technique that can provide a good appearance to display devices even when transparent conductive layers are patterned.

In order to improve the appearance produced with a patterned transparent conductive layer, for example, Japanese Patent Application Laid-Open (JP-A) No. 2008-98169 proposes a transparent conductive film including a transparent film substrate, a transparent conductive layer and two undercoat layers different in refractive index placed between the transparent film substrate and the transparent conductive layer. The publication also discloses an example of such a transparent conductive film that includes a transparent film substrate, and a high-refractive-index silicon-tin oxide layer with a refractive index of 1.7 (10 nm or more in thickness), a low-refractive-index silicon oxide layer with a refractive index of 1.43 (30 nm in thickness) and an ITO film with a refractive index of 1.95 (15 nm in thickness) as a transparent conductive layer, which are formed in this order on the transparent film substrate.

SUMMARY OF THE INVENTION

In the transparent conductive film described in Japanese Patent Application Laid-Open (JP-A) No. 2008-98169, however, the difference between the pattern portion and the pattern opening portion may be clear in some cases, and therefore, it is still insufficient to improve the appearance.

The invention provides a transparent conductive film having a patterned transparent conductive layer in which the difference between the pattern portion and the pattern opening portion is reduced so that a good appearance is provided.

The invention also provides a transparent conductive laminate and a touch panel each using such a transparent conductive film, and a method for producing such a transparent conductive film.

The transparent conductive film of the present invention is a transparent conductive film, comprising a transparent film substrate, and a first transparent dielectric layer, a second transparent dielectric layer and a transparent conductive layer that are formed on one or both sides of the transparent film substrate in this order from the transparent film substrate side, wherein the transparent conductive layer is patterned, the relation $n_2 < n_3 < n_1$ is satisfied, wherein $n_1$ is the refractive index of the first transparent dielectric layer, $n_2$ is the refractive index of the second transparent dielectric layer, and $n_3$ is the refractive index of the transparent conductive layer, the first transparent dielectric layer has a thickness of from 2 nm to less than 10 nm, the second transparent dielectric layer has a thickness of from 20 nm to 55 nm, and the transparent conductive layer has a thickness of from 15 nm to 30 nm.

In the transparent conductive film of the invention, the refractive indices of the respective layers satisfy the relation $n_2 < n_3 < n_1$, and the thickness of each layer is set in the above range, so that the difference in reflectance between the pattern portion and the portion immediately below the pattern opening portion can be reduced. According to these features, the difference between the pattern portion and the pattern opening portion is reduced so that a transparent conductive film with a good appearance can be provided.

In the above, it is preferable that $n_1$ is from 2.0 to 2.3, $n_2$ is from 1.4 to 1.5, and $n_3$ is from 1.9 to 2.1. In the above range, the difference in reflectance between the pattern portion and the portion immediately below the pattern opening portion can be effectively reduced.

In the above, it is preferable that the transparent conductive layer has a pattern opening portion, and the first and second transparent dielectric layers have a total optical thickness of from 30 nm to 100 nm immediately below the pattern opening portion. In this case, both transparency and uniformity in the thickness of the dielectric layer can be achieved, while the difference in reflectance between the pattern portion and the portion immediately below the pattern opening portion can be effectively reduced. The "optical thickness" of each layer corresponds to a value obtained by multiplying the physical thickness of each layer (the thickness as measured with a thickness gauge or the like) by the refractive index of the layer. In an embodiment of the invention, the refractive index is determined with light at a wavelength of 589.3 nm. In the specification, the physical thickness is also simply referred to as "thickness."

In the above, it is preferable that the transparent film substrate has a thickness of from 2 μm to 200 μm. According to this feature, a relatively thin film can be easily produced, while a certain mechanical strength can be ensured.

In the above, it is preferable that the first transparent dielectric layer comprises a complex oxide containing at least indium oxide and cerium oxide. According to this feature, a higher refractive index than that of the transparent conductive layer can be achieved so that optical control can be easily performed. In addition, when the first transparent dielectric layer is produced by a dry process such as a sputtering method using the complex oxide as a raw material, a relatively high deposition rate can be used so that the productivity can be improved. The complex oxide may be added with any other component than indium oxide and cerium oxide, such as tin oxide, Al, Sb, Ga, Ge, or Zn. In particular, the complex oxide preferably contains tin oxide, because such a complex oxide can be easily sintered into a high-density product.

In the above, it is preferable that the complex oxide contains 100 parts by weight of indium oxide, 0 to 20 parts by weight of tin oxide and 10 to 60 parts by weight of cerium oxide. According to this feature, a higher refractive index than that of the transparent conductive layer can be achieved so that optical thickness control can be easily performed. In this case, the cerium oxide content may be from more than 40 to 60 parts by weight, based on 100 parts by weight of indium oxide, so that the first transparent dielectric layer can have a higher refractive index, which makes it easier to achieve a higher refractive index than that of the transparent conductive layer. This feature can effectively reduce the difference in reflectance between the pattern portion and the portion immediately below the pattern opening portion. When the cerium oxide content is 60 parts by weight or less, the first transparent dielectric layer can be formed without any reduction in deposition rate.

In the above, it is preferable that the second transparent dielectric layer is made of an inorganic material. According to this feature, photo-deterioration can be prevented so that the durability of the transparent conductive film can be improved. In this case, the inorganic material is preferably $SiO_2$. Since $SiO_2$ is highly resistant to acid in addition to being inexpensive and easily-available, it can prevent degradation of the second transparent dielectric layer when the transparent conductive layer is patterned by etching with acid.

In the above, it is preferable that the first transparent dielectric layer is formed by a vacuum deposition method, a sputtering method or an ion plating method. According to this feature, the first transparent dielectric layer can be produced with a uniform thickness, because all the methods listed above can easily control the thickness. The film is preferably produced under such conditions that gaseous impurities are removed as much as possible from the atmosphere for the film production so that the thickness of the first transparent dielectric layer can be easily controlled in the range of from 2 nm to less than 10 nm.

In the above, it is preferable that the first transparent dielectric layer, the second transparent dielectric layer and the transparent conductive layer are formed on one side of the transparent film substrate, and it further comprises a transparent substrate placed on another side of the transparent film substrate opposite to the first transparent dielectric layer. According to this feature, the mechanical strength of the film can be improved, and in particular, curling or the like can be prevented.

In the above, it is preferable that the first transparent dielectric layer, the second transparent dielectric layer and the transparent conductive layer are formed on both sides of the transparent film substrate, and it further comprises a transparent substrate placed on a side of one of the transparent conductive layers opposite to the second transparent dielectric layer. Also in this case, the mechanical strength of the film can be improved, and in particular, curling or the like can be prevented.

The transparent conductive film of the invention is suitable for use in touch panels based on various detection methods (such as capacitive types and resistive film types) and particularly suitable for use in capacitive touch panels. Capacitive touch panels have a patterned transparent conductive layer formed over the surface of the display unit. In such capacitive tough panels, therefore, the function according to the invention (the function of reducing the difference in reflectance between the pattern portion and the portion immediately below the pattern opening portion) is more effectively performed.

Also, the transparent conductive laminate of the present invention is a transparent conductive laminate, comprising two or more transparent conductive films laminated with a transparent pressure-sensitive adhesive layer interposed therebetween, wherein at least one of the transparent conductive films is the above transparent conductive film of the invention, and the transparent conductive layer of the transparent conductive film is placed on at least one side of the transparent conductive laminate. According to this feature, locations along the X- and Y-axes can be detected on each transparent conductive film, while the same advantageous effect as in the case of the above transparent conductive film of the invention can be obtained.

The invention is also directed to a touch panel including the transparent conductive film of the invention stated above or the transparent conductive laminate of the invention stated above. The touch panel of the invention can produce the same advantageous effect as the transparent conductive film or the transparent conductive laminate of the invention.

Also, the method for producing a transparent conductive film of the invention is a method for producing the above transparent conductive film of the invention, comprising the steps of: forming the first transparent dielectric layer, the second transparent dielectric layer and the transparent conductive layer on one or both sides of the transparent film substrate in this order from the transparent film substrate side; and patterning the transparent conductive layer by etching with an acid. The transparent conductive film of the invention can be easily produced by this method.

In the above, it is preferable that the method further comprises the step of heat-treating the patterned transparent conductive layer after the patterning of the transparent conductive layer. According to this feature, the component of the transparent conductive layer can be crystallized to improve the transparency and the conductivity.

DETAILED DESCRIPTION OF THE PREFERRED EMBODIMENTS

Figure 1:
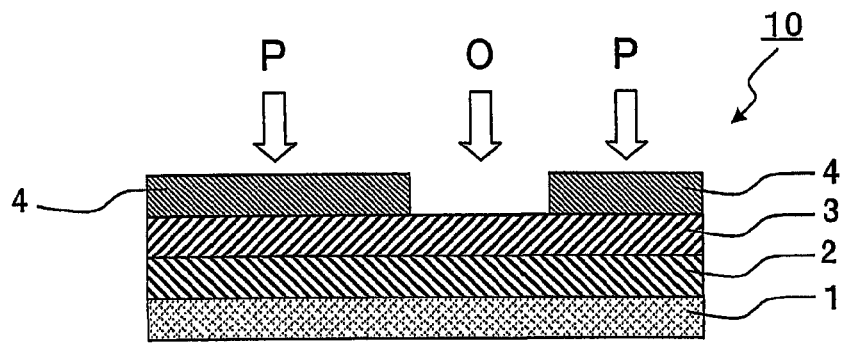
FIG. 1 is a cross-sectional view of a transparent conductive film according to a first embodiment of the invention.

Embodiments of the invention are described below with reference to the drawings. In the drawings, the same elements are represented by the same reference characters, and undue duplication of the description will be avoided.

First Embodiment

FIG. 1 is a cross-sectional view of a transparent conductive film according to a first embodiment of the invention. Referring to FIG. 1, the transparent conductive film 10 includes a transparent film substrate 1 and a first transparent dielectric layer 2, a second transparent dielectric layer 3 and a transparent conductive layer 4 that are sequentially formed on one side of the transparent film substrate 1. The transparent conductive layer 4 is patterned to form a pattern portion P and a pattern opening portion O.

The transparent conductive film 10 satisfies the relation n2<n3<n1, wherein n1, n2 and n3 are the refractive indices of the first transparent dielectric layer 2, the second transparent dielectric layer 3 and the transparent conductive layer 4, respectively. The first transparent dielectric layer 2 has a thickness of from 2 nm to less than 10 nm (preferably from 2 to 9 nm, more preferably from 3 to 8 nm). The second transparent dielectric layer 3 has a thickness of from 20 to 55 nm (preferably from 20 to 45 nm). The transparent conductive layer 4 has a thickness of from 15 to 30 nm (preferably from 18 to 28 nm). These features reduce the difference in reflectance between the pattern portion P and the portion immediately below the pattern opening portion O. Since the difference between the pattern portion P and the pattern opening portion O is reduced, there is provided a transparent conductive film having a good appearance. In the transparent conductive film 10, the total of the optical thicknesses of the first and second transparent dielectric layers 2 and 3 is preferably from 30 to 100 nm, more preferably from 33 to 100 nm, immediately below the pattern opening portion O of the transparent conductive layer 4. This feature can not only effectively reduce the difference in reflectance between the pattern portion P and the portion immediately below the pattern opening portion O but also satisfy both transparency and uniformity in the thickness of the dielectric layer.

There is no particular limitation to the transparent film substrate 1, and various types of plastic films having transparency may be used. Examples of the material for the transparent film substrate 1 include polyester resins, acetate resins, polyethersulfone resins, polycarbonate resins, polyamide resins, polyimide resins, polyolefin resins, (meth)acrylic resins, polyvinyl chloride resins, polyvinylidene chloride resins, polystyrene resins, polyvinyl alcohol resins, polyarylate resins, and polyphenylene sulfide resins. In particular, polyester resins, polycarbonate resins, and polyolefin resins are preferred.

Examples thereof also include polymer films as disclosed in JP-A No. 2001-343529 (WO01/37007) and a resin composition that contains a thermoplastic resin having a side chain of a substituted and/or unsubstituted imide group and a thermoplastic resin having a side chain of substituted and/or unsubstituted phenyl and nitrile groups. Specifically, a polymer film of a resin composition containing an alternating copolymer made of isobutylene and N-methylmaleimide, and an acrylonitrile-styrene copolymer may be used.

The transparent film substrate 1 preferably has a thickness of from 2 to 200 μm, more preferably from 2 to 100 μm. In this range, a relatively thin film can be easily produced, while a certain mechanical strength can be ensured.

The surface of the transparent film substrate 1 may be previously subject to sputtering, corona discharge treatment, flame treatment, ultraviolet irradiation, electron beam irradiation, chemical treatment, etching treatment such as oxidation, or undercoating treatment such that the adhesion of the first transparent dielectric layer 2 formed thereon to the transparent film substrate 1 can be improved. If necessary, the transparent film substrate 1 may also be subjected to dust removing or cleaning by solvent cleaning, ultrasonic cleaning or the like, before the first transparent dielectric layer 2 is formed.

The first and second transparent dielectric layers 2 and 3 may each be made of an inorganic material, an organic material or a mixture of an inorganic material and an organic material. Examples of the inorganic material include NaF (1.3), $Na_3AlF_6$ (1.35), LiF (1.36), $MgF_2$ (1.38), $CaF_2$ (1.4), $BaF_2$ (1.3), $SiO_2$ (1.46), $LaF_3$ (1.55), $CeF_3$ (1.63), and $Al_2O_3$ (1.63), wherein each number inside the parentheses is the refractive index of each material. In particular, $SiO_2$, $MgF_2$, $Al_2O_3$, or the like is preferably used. Besides the above, a complex oxide containing at least indium oxide and cerium oxide may also be used. Examples of the organic material include acrylic resins, urethane resins, melamine resins, alkyd resins, siloxane polymers, and organosilane condensates.

In particular, the first transparent dielectric layer 2 is preferably made of a complex oxide containing at least indium oxide and cerium oxide. In this case, a higher refractive index than that of the transparent conductive layer 4 can be achieved so that optical control can be easily performed. In addition, when the first transparent dielectric layer 2 is produced by a dry process such as a sputtering method using the complex oxide as a raw material, a relatively high deposition rate can be used so that the productivity can be improved.

In particular, the complex oxide is preferably one containing 100 parts by weight of indium oxide, 0 to 20 parts by weight of tin oxide, and 10 to 60 parts by weight of cerium oxide. In this case, the optical thickness can be easily controlled, while a higher refractive index than that of the transparent conductive layer can be readily achieved. The material used to form the complex oxide is preferably a sintered mixture of the respective oxide components. In view of optical properties, the content of tin oxide in the complex oxide is preferably from 3 to 15 parts by weight, based on 100 parts by weight of indium oxide. The cerium oxide content is preferably from more than 40 to 60 parts by weight (in particular preferably from more than 40 to 50 parts by weight) based on 100 parts by weight of indium oxide, so that the first transparent dielectric layer 2 can have a higher refractive index, which makes it easier to achieve a higher refractive index than that of the transparent conductive layer 4. This feature can effectively reduce the difference in reflectance between the pattern portion P and the portion immediately below the pattern opening portion O. In this case, the physical thickness to achieve the desired optical thickness can also be reduced, so that the thickness of the transparent conductive film 10 can be easily reduced.

The second transparent dielectric layer 3 is preferably made of an inorganic material. According to this feature, photo-deterioration can be prevented so that the durability of the transparent conductive film 10 can be improved. In this case, the inorganic material is preferably $SiO_2$. Since $SiO_2$ is highly resistant to acid in addition to being inexpensive and easily-available, it can prevent degradation of the second transparent dielectric layer 3 when the transparent conductive layer 4 is pattered by etching with acid.

The first and second transparent dielectric layers 2 and 3 provided between the transparent film substrate 1 and the transparent conductive layer 4 do not function as conductive layers. In other words, the first and second transparent dielectric layers 2 and 3 are provided as dielectric layers capable of insulating pattern portions P of the transparent conductive layer 4 from one another. Therefore, the first and second transparent dielectric layers 2 and 3 each typically have a surface resistance of $1\times10^6$ Ω/square or more, preferably $1\times10^7$ Ω/square or more, more preferably $1\times10^8$ Ω/square or more. The surface resistance of the first and second transparent dielectric layers 2 and 3 does not have any particular upper limit. While the surface resistance of the first and second transparent dielectric layers 2 and 3 may generally has an upper limit of about $1\times10^{13}$ Ω/square, which corresponds to a measuring limit, it may be higher than $1\times10^{13}$ Ω/square.

Examples of materials that may be used to form the transparent conductive layer 4 include, but are not limited to, oxides of at least one metal (or semimetal) selected from the group consisting of indium, tin, zinc, gallium, antimony, titanium, silicon, zirconium, magnesium, aluminum, gold, silver, copper, palladium, and tungsten. Such oxides may be optionally added with any metal atom selected from the above group or any oxide thereof. For example, indium oxide containing with tin oxide or tin oxide containing with antimony is preferably used.

The refractive index (n1) of the first transparent dielectric layer 2 is preferably from 2.0 to 2.3 (more preferably from 2.1 to 2.25). The refractive index (n2) of the second transparent dielectric layer 3 is preferably from 1.4 to 1.5. The refractive index (n3) of the transparent conductive layer 4 is preferably from 1.9 to 2.1 (more preferably from 1.95 to 2.05). When each layer has a refractive index in the above range, the difference in reflectance between the pattern portion P and the portion immediately below the pattern opening portion O can be effectively reduced, while transparency can be ensured.

In view of uniformity in thickness, prevention of cracking and improvement in transparency, the total of the thicknesses of the first and second transparent dielectric layers 2 and 3 and the transparent conductive layer 4 is preferably from 40 to 90 nm, more preferably from 40 to 85 nm. In order to more effectively reduce the difference in reflectance between the pattern portion P and the portion immediately below the pattern opening portion O, the difference between the total of the optical thicknesses of the first and second transparent dielectric layers 2 and 3 and the optical thickness of the transparent conductive layer 4 is preferably from 20 to 70 nm, more preferably from 20 to 50 nm.

An illustrative method for producing the transparent conductive film 10 typically includes the steps of forming the first transparent dielectric layer 2, the second transparent dielectric layer 3 and the transparent conductive layer 4 on one side of the transparent film substrate 1 in this order from the transparent film substrate 1 side and patterning the transparent conductive layer 4 by etching with acid.

Examples of methods for forming each of the first transparent dielectric layer 2, the second transparent dielectric layer 3, and the transparent conductive layer 4 include a vacuum deposition method, a sputtering method, an ion plating method, and so on. Among these methods, sputtering methods are generally used, while any appropriate method may be used depending on the type of the material and the desired thickness. In addition, coating methods may also be used to form the second transparent dielectric layer 3.

In the etching, the transparent conductive layer 4 may be covered with a patterning mask and etched with an acid. The acid may be an inorganic acid such as hydrochloric acid, hydrobromic acid, sulfuric acid, nitric acid, or phosphoric acid, an organic acid such as acetic acid, any mixture thereof, or an aqueous solution of any of the foregoing.

After the transparent conductive layer 4 is patterned, if necessary, the patterned transparent conductive layer 4 may be subjected to heat treatment. In this case, the component of the transparent conductive layer 4 can be crystallized so that the transparency and the conductivity can be improved. In this treatment, the heating temperature is typically in the range of from 100 to 180° C., and the treatment time is typically in the range of from 15 to 180 minutes.

The transparent conductive layer 4 may be patterned in any of various forms such as stripes depending on the intended use of the transparent conductive film 10.

Second Embodiment

Figure 2:
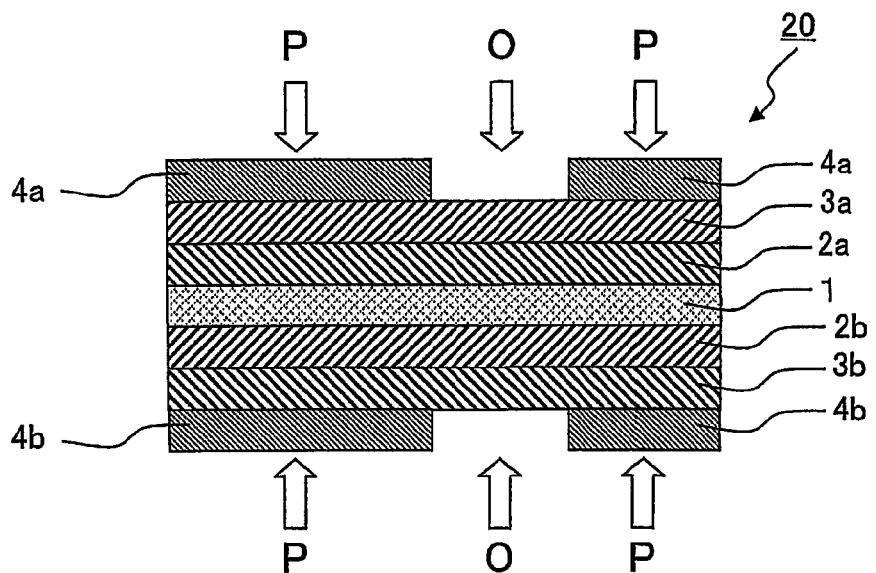
FIG. 2 is a cross-sectional view of a transparent conductive film according to a second embodiment of the invention.

Next, a description is given of a transparent conductive film according to a second embodiment of the invention. FIG. 2 is a cross-sectional view of the transparent conductive film according to the second embodiment of the invention. Referring to FIG. 2, the transparent conductive film 20 includes a transparent film substrate 1 and a first transparent dielectric layer 2a, a second transparent dielectric layer 3a and a transparent conductive layer 4a that are sequentially formed on the upper side of the transparent film substrate 1, and another first transparent dielectric layer 2b, another second transparent dielectric layer 3b and another transparent conductive layer 4b that are sequentially formed on the lower side of the transparent film substrate 1. The transparent conductive layers 4a and 4b are each patterned to form a pattern portion P and a pattern opening portion O.

The transparent conductive film 20 satisfies the relation $n2a<n3a<n1a$, wherein n1a, n2a and n3a are the refractive indices of the first transparent dielectric layer 2a, the second transparent dielectric layer 3a and the transparent conductive layer 4a, respectively. The first transparent dielectric layer 2a has a thickness of from 2 nm to less than 10 nm (preferably from 2 to 9 nm, more preferably from 3 to 8 nm). The second dielectric layer 3a has a thickness of from 20 to 55 nm (preferably from 20 to 45 nm). The transparent conductive layer 4a has a thickness of from 15 to 30 nm (preferably from 18 to 28 nm). In addition, the transparent conductive film 20 satisfies the relation $n2b<n3b<n1b$, wherein n1b, n2b and n3b are the refractive indices of the first transparent dielectric layer 2b, the second transparent dielectric layer 3b and the transparent conductive layer 4b, respectively. The first transparent dielectric layer 2b has a thickness of from 2 nm to less than 10 nm (preferably from 2 to 9 nm, more preferably from 3 to 8 nm). The second dielectric layer 3b has a thickness of from 20 to 55 nm (preferably from 20 to 45 nm). The transparent conductive layer 4b has a thickness of from 15 to 30 nm (preferably from 18 to 28 nm). These features produce the same effect as those of the transparent conductive film 10 described above produce.

Each of the first transparent dielectric layers 2a and 2b, each of the second transparent dielectric layers 3a and 3b, and each of the transparent conductive layers 4a and 4b to be used may be the same as the first transparent dielectric layer 2, the second transparent dielectric layer 3 and the transparent conductive layer 4 of the above transparent conductive film 10, respectively. The first transparent dielectric layers 2a and 2b may be made of the same or different materials and may have the same or different thicknesses. This may apply to the second transparent dielectric layers 3a and 3b or the transparent conductive layers 4a and 4b. The transparent conductive film 20 may be produced using the above method of producing the transparent conductive film 10, except that each layer is formed on both sides of the transparent film substrate 1.

When the transparent conductive layers 4a and 4b are formed on both sides of the transparent film substrate 1 as shown in FIG. 2, the portion immediately below the pattern opening portion O is provided for each of the transparent conductive layers 4a and 4b. In the transparent conductive film 20 of FIG. 2, each of the pattern portion P and the pattern opening portion O of the transparent conductive layer 4a coincides with each of the pattern portion P and the pattern opening portion O of the transparent conductive layer 4b.

However, these portions do not have to coincide with each other, and both sides may be differently patterned as needed. This may apply to the drawings described below.

Third Embodiment

Figure 3:
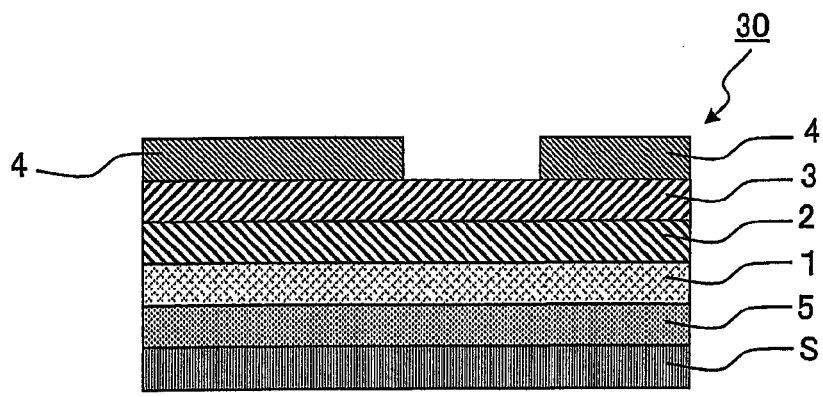
FIG. 3 is a cross-sectional view of a transparent conductive film according to a third embodiment of the invention.

Next, a description is given of a transparent conductive film according to a third embodiment of the invention. FIG. 3 is a cross-sectional view of the transparent conductive film according to the third embodiment of the invention. Referring to FIG. 3, the transparent conductive film 30 includes the structure of the transparent conductive film 10 described above and a separator S placed on the lower side of the transparent film substrate 1 with a transparent pressure-sensitive adhesive layer 5 interposed therebetween.

Any transparent pressure-sensitive adhesive may be used for the transparent pressure-sensitive adhesive layer 5 without limitation. For example, the pressure-sensitive adhesive may be appropriately selected from transparent adhesives based on polymers such as acrylic polymers, silicone polymers, polyester, polyurethane, polyamide, polyvinyl ether, vinyl acetate-vinyl chloride copolymers, modified polyolefins, epoxy polymers, fluoropolymers, and rubbers such as natural rubbers and synthetic rubbers. In particular, acrylic pressure-sensitive adhesives are preferably used, because they have good optical transparency and good weather or heat resistance and exhibit suitable wettability and adhesion properties such as cohesiveness and adhesiveness.

The transparent pressure-sensitive adhesive layer 5 is generally made from a pressure-sensitive adhesive solution (with a solids content of about 10 to about 50% by weight) containing a base polymer or a composition thereof dissolved or dispersed in a solvent. The solvent to be used may be appropriately selected from an organic solvent such as toluene or ethyl acetate or water or the like depending on the type of the pressure-sensitive adhesive.

The transparent conductive film 30 has the separator S. Therefore, the transparent pressure-sensitive adhesive layer 5 may be transferred and bonded to the desired surface, after the separator S is removed. For example, the separator S to be used preferably includes a polyester film or the like and a migration-preventing layer and/or a release layer placed thereon on the transparent pressure-sensitive adhesive layer 5 side.

The total thickness of the separator S is preferably 30 μm or more, more preferably from 60 to 100 μm. This is to prevent deformation of the transparent pressure-sensitive adhesive layer 5 (dents) in a case where the separator S is placed on the transparent pressure-sensitive adhesive layer 5 and then stored in the form of a roll, in which the deformation (dents) would be expected to occur due to foreign particles or the like intruding between portions of the rolled layer.

The migration-preventing layer may be made of an appropriate material for preventing migration of migrant components in the polyester film, particularly for preventing migration of low molecular weight oligomer components in the polyester. An inorganic or organic material or a composite of inorganic and organic materials may be used as a material for forming the migration-preventing layer. The thickness of the migration-preventing layer may be set in the range of 0.01 to 20 μm as needed. The migration-preventing layer may be formed by any method such as coating, spraying, spin coating, and in-line coating. Vacuum deposition, sputtering, ion plating, spray thermal decomposition, chemical plating, electroplating, or the like may also be used.

The release layer may be made of an appropriate release agent such as a silicone release agent, a long-chain alkyl release agent, a fluorochemical release agent, and a molybdenum sulfide release agent. The thickness of the release layer may be set as appropriate in view of the release effect. In general, the thickness is preferably 20 μm or less, more preferably in the range of 0.01 to 10 μm, particularly preferably in the range of 0.1 to 5 μm, in view of handleability such as flexibility. A production method of the release layer is not particularly limited, and may be formed in the same manner as in the case of the migration-preventing layer.

Fourth Embodiment

Figure 4:
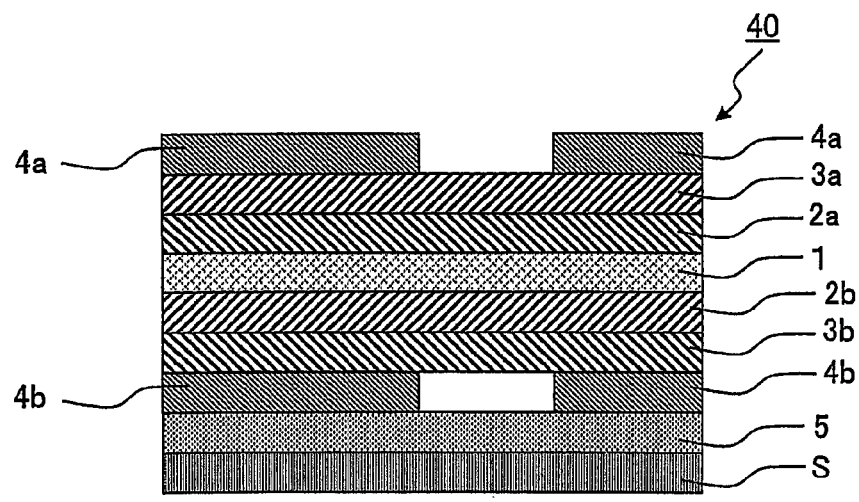
FIG. 4 is a cross-sectional view of a transparent conductive film according to a fourth embodiment of the invention.

Next, a description is given of a transparent conductive film according to a fourth embodiment of the invention. FIG. 4 is a cross-sectional view of the transparent conductive film according to the fourth embodiment of the invention. Referring to FIG. 4, the transparent conductive film 40 includes the structure of the transparent conductive film 20 described above and a separator S placed on the transparent conductive layer 4b on the lower side of the drawing with a transparent pressure-sensitive adhesive layer 5 interposed therebetween. This structure produces the same advantageous effect as the transparent conductive film 20 or 30 described above.

Fifth Embodiment

Figure 5:
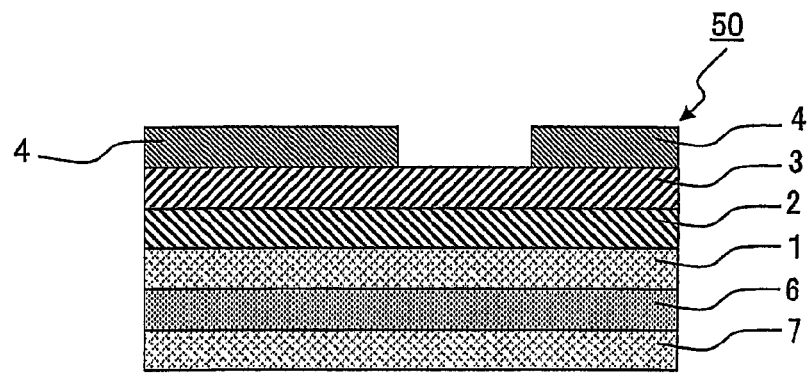
FIG. 5 is a cross-sectional view of a transparent conductive film according to a fifth embodiment of the invention.

Next, a description is given of a transparent conductive film according to a fifth embodiment of the invention. FIG. 5 is a cross-sectional view of the transparent conductive film according to the fifth embodiment of the invention. Referring to FIG. 5, the transparent conductive film 50 includes the structure of the transparent conductive film 10 described above and a transparent substrate 7 placed on the lower side of the transparent film substrate 1 (namely, on the surface of the transparent film substrate 1 opposite to the first transparent dielectric layer 2) with a transparent pressure-sensitive adhesive layer 6 interposed therebetween. The transparent pressure-sensitive adhesive layer 6 may be made of the same material as the transparent pressure-sensitive adhesive layer 5 described above.

The transparent substrate 7 preferably has a thickness of from 10 to 300 μm, more preferably from 20 to 250 μm. When the transparent substrate 7 is formed of a plurality of substrate films, each substrate film preferably has a thickness of from 10 to 200 μm, more preferably from 20 to 150 μm. The transparent substrate 7 or the substrate film may be made of the same material as the transparent film substrate 1 described above.

The transparent substrate 7 may be bonded to the transparent film substrate 1 by a process including forming the transparent pressure-sensitive adhesive layer 6 on the transparent substrate 7 and then attaching the transparent film substrate 1 thereto or by a process including forming the transparent pressure-sensitive adhesive layer 6 contrarily on the transparent film substrate 1 and then attaching the transparent substrate 7 thereto. The latter process is more advantageous in terms of productivity, because it allows continuous formation of the transparent pressure-sensitive adhesive layer 6 on the transparent film substrate 1 used in the form of a roll. Alternatively, the transparent substrate 7 may be formed by sequentially laminating a plurality of substrate films with a transparent pressure-sensitive adhesive layer or layers (not shown) on the transparent film substrate 1. The transparent pressure-sensitive adhesive layer for use in laminating substrate films may be the same as the transparent pressure-sensitive adhesive layer 5 described above.

After the bonding of the transparent substrate 7, for example, the transparent pressure-sensitive adhesive layer 6 has a cushion effect and thus can function to improve the scratch resistance of the transparent conductive layer 4 formed on one side of the transparent film substrate 1 or to improve the tap properties thereof for touch panels, such as so called pen input durability and surface pressure durability. In terms of performing this function better, it is preferred that the elastic modulus of the transparent pressure-sensitive adhesive layer 6 is set in the range of 1 to 100 N/cm$^2$ and that its thickness is set at 1 μm or more, preferably in the range of 5 to 100 μm. If the thickness is as described above, the effect can be sufficiently produced, and the adhesion between the transparent substrate 7 and the transparent film substrate 1 can also be sufficient. Here, in other aspects, the elastic modulus and the thickness of the pressure-sensitive adhesive layer to be applied to the transparent conductive film may be the same as those described above.

The transparent substrate 7 bonded through the transparent pressure-sensitive adhesive layer 6 imparts good mechanical strength to the transparent film substrate 1 to improve the pen input durability or the contact pressure durability and contribute to the prevention of curling or the like. This embodiment provides an example where the transparent substrate 7 is bonded to the transparent film substrate 1 with the transparent pressure-sensitive adhesive layer 6 interposed therebetween. Alternatively, for example, the transparent substrate 7 may be formed by applying a transparent liquid resin to the transparent film substrate 1 and drying it.

If necessary, a hard coat layer (not shown) may also be formed on the outer surface of the transparent substrate 7 (the surface opposite to the transparent pressure-sensitive adhesive layer 6) in order to protect the outer surface. For example, the hard coat layer is preferably made of a cured resin film such as a melamine, urethane, alkyd, acrylic, or silicone resin film. The hard coat layer preferably has a thickness of from 0.1 to 30 μm in view of hardness and the prevention of cracking or curling.

Sixth Embodiment

Figure 6:
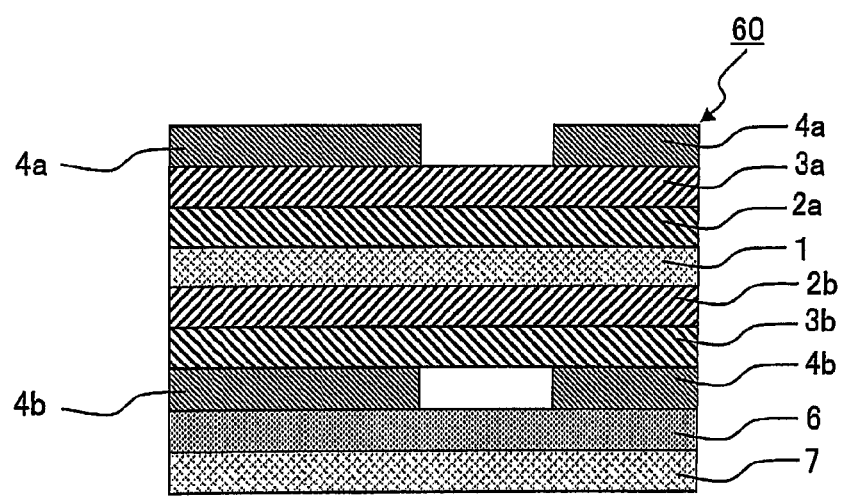
FIG. 6 is a cross-sectional view of a transparent conductive film according to a sixth embodiment of the invention.

Next, a description is given of a transparent conductive film according to a sixth embodiment of the invention. FIG. 6 is a cross-sectional view of the transparent conductive film according to the sixth embodiment of the invention. Referring to FIG. 6, the transparent conductive film 60 includes the structure of the transparent conductive film 20 described above and a transparent substrate 7 placed on the lower side of the transparent conductive layer 4b (namely, on the surface of the transparent conductive layer 4b opposite to the second transparent dielectric layer 3b) with a transparent pressure-sensitive adhesive layer 6 interposed therebetween. This structure produces the same advantageous effect as the transparent conductive film 20 or 50 described above.

While transparent conductive films according to some embodiments of the invention have been described above, the embodiments of the invention is not limited to those described above. For example, the second transparent dielectric layer may also be patterned. The transparent conductive film of the present invention may be provided with an antiglare layer or an antireflection layer for the purpose of increasing visibility. When the transparent conductive film is used for a resistive film type touch panel, an antiglare layer or an antireflection layer may be formed on the outer surface of the transparent substrate (on the side opposite to the pressure-sensitive adhesive layer) similarly to the hard coat layer. An antiglare layer or an antireflection layer may also be formed on the hard coat layer. On the other hand, when the transparent conductive film is used for a capacitive type touch panel, an antiglare layer or an antireflection layer may be formed on the transparent conductive layer.

For example, the material to be used to form the antiglare layer may be, but not limited to, an ionizing radiation-curable resin, a thermosetting resin, a thermoplastic resin, or the like. The thickness of the antiglare layer is preferably from 0.1 to 30 μm.

The antireflection layer may use titanium oxide, zirconium oxide, silicon oxide, magnesium fluoride, or the like. In order to produce a more significant antireflection function, a laminate of a titanium oxide layer(s) and a silicon oxide layer(s) is preferably used. Such a laminate is preferably a two-layer laminate comprising a high-refractive-index titanium oxide layer (refractive index: about 2.35), which is formed on the transparent substrate or the hard coat layer, and a low-refractive-index silicon oxide layer (refractive index: about 1.46), which is formed on the titanium oxide layer. Also preferred is a four-layer laminate which comprises the two-layer laminate and a titanium oxide layer and a silicon oxide layer formed in this order on the two-layer laminate. The antireflection layer of such a two- or four-layer laminate can evenly reduce reflection over the visible light wavelength range (380 to 780 nm).

Seventh Embodiment

Figure 7:
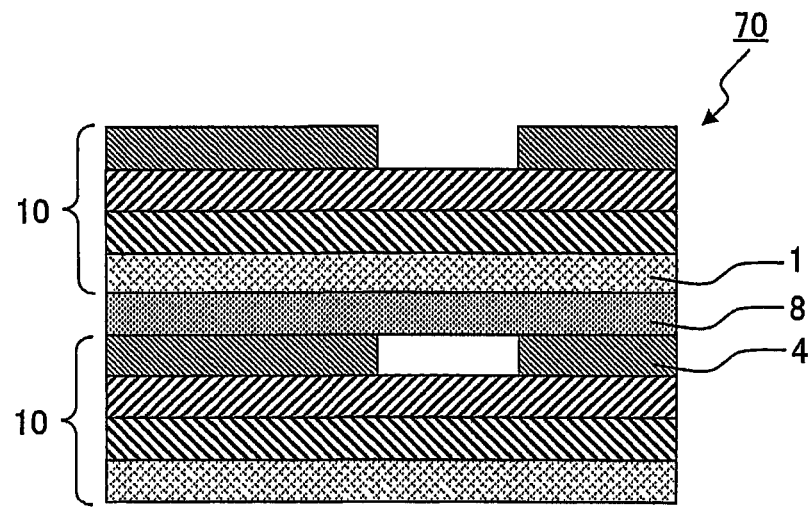
FIG. 7 is a cross-sectional view of a transparent conductive laminate according to a seventh embodiment of the invention.

Next, a description is given of a transparent conductive laminate according to a seventh embodiment of the invention. FIG. 7 is a cross-sectional view of the transparent conductive laminate according to the seventh embodiment of the invention. Referring to FIG. 7, the transparent conductive laminate 70 includes two pieces of the transparent conductive film 10 described above that are laminated with a transparent pressure-sensitive adhesive layer 8 interposed therebetween. Specifically, two pieces of the transparent conductive film 10 are laminated in such a manner that the transparent film substrate 1 of the transparent conductive film 10 on one side is bonded to the transparent conductive layer 4 of the transparent conductive film 10 on the other side with the transparent pressure-sensitive adhesive layer 8 interposed therebetween. The transparent pressure-sensitive adhesive layer 8 may be made of the same material as the transparent pressure-sensitive adhesive layer 5 described above. The transparent conductive laminate 70 including two pieces of the transparent conductive film 10 makes it possible to detect locations along the X- and Y-axes on each transparent conductive film 10.

Eighth Embodiment

Figure 8:
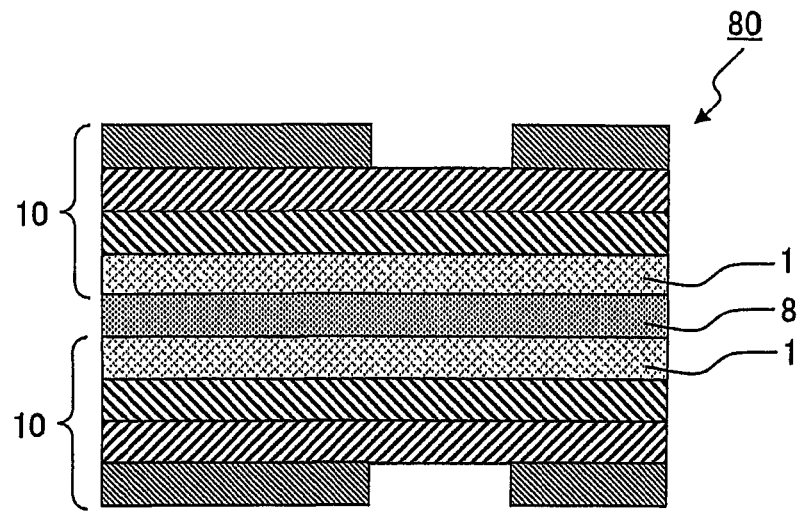
FIG. 8 is a cross-sectional view of a transparent conductive laminate according to an eighth embodiment of the invention.

Next, a description is given of a transparent conductive laminate according to an eighth embodiment of the invention. FIG. 8 is a cross-sectional view of the transparent conductive laminate according to the eighth embodiment of the invention. Referring to FIG. 8, the transparent conductive laminate 80 includes two pieces of the transparent conductive film 10 and a transparent pressure-sensitive adhesive layer 8 with which the transparent film substrates 1 are bonded together. The other features are the same as those of the transparent conductive laminate 70.

Ninth Embodiment

Figure 9:
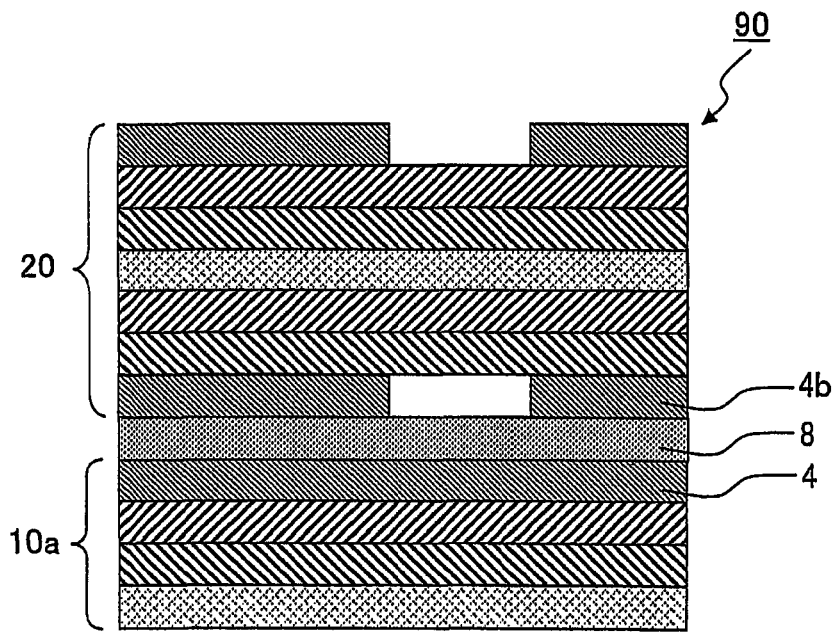
FIG. 9 is a cross-sectional view of a transparent conductive laminate according to a ninth embodiment of the invention.

Next, a description is given of a transparent conductive laminate according to a ninth embodiment of the invention. FIG. 9 is a cross-sectional view of the transparent conductive laminate according to the ninth embodiment of the invention. Referring to FIG. 9, the transparent conductive laminate 90 includes the transparent conductive film 10a and the transparent conductive film 20 that are laminated with a transparent pressure-sensitive adhesive layer 8 interposed therebetween. Specifically, the transparent conductive film 10a and the transparent conductive film 20 are laminated in such a manner that the transparent conductive layer 4b of the transparent conductive film 20 is bonded to the transparent conductive layer 4 of the transparent conductive film 10a with the transparent pressure-sensitive adhesive layer 8 interposed therebetween. The transparent conductive film 10a may be the same as the transparent conductive film 10 described above, except that the transparent conductive layer 4 is not patterned. In this structure, the transparent conductive layer 4 of the transparent conductive film 10a functions as a shield layer so that noise caused by electromagnetic waves from the display can be reduced. Therefore, the transparent conductive laminate 90 makes it possible to improve the accuracy of position detection.

Tenth Embodiment

Figure 10:
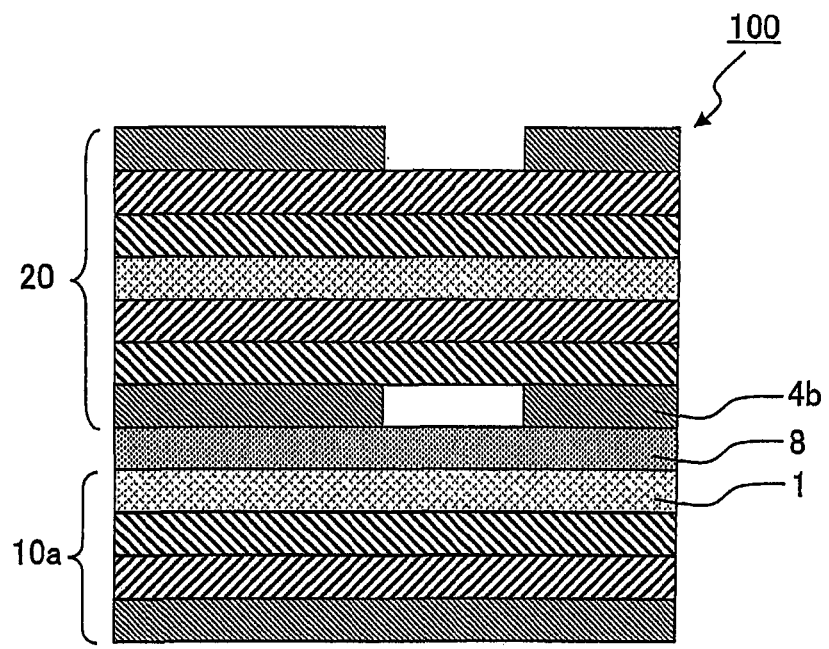
FIG. 10 is a cross-sectional view of a transparent conductive laminate according to a tenth embodiment of the invention.

Next, a description is given of a transparent conductive laminate according to a tenth embodiment of the invention. FIG. 10 is a cross-sectional view of the transparent conductive laminate according to the tenth embodiment of the invention. Referring to FIG. 10, the transparent conductive laminate 100 includes the transparent conductive film 20 and the transparent conductive film 10a The transparent conductive film 20 and the transparent conductive film 10a are laminated in such a manner that the transparent conductive layer 4b of the transparent conductive film 20 is bonded to the transparent film substrate 1 of the transparent conductive film 10a with the transparent pressure-sensitive adhesive layer 8 interposed therebetween. The other features are the same as those of the transparent conductive laminate 90.

While transparent conductive laminates according to some embodiments of the invention have been described above, the transparent conductive laminate of the invention is not limited to those described above. For example, three or more pieces of the transparent conductive film may be laminated, and two or more pieces of the transparent conductive film having transparent conductive layers on both sides like the transparent conductive film 20 may be laminated.

Eleventh Embodiment

Figure 11:
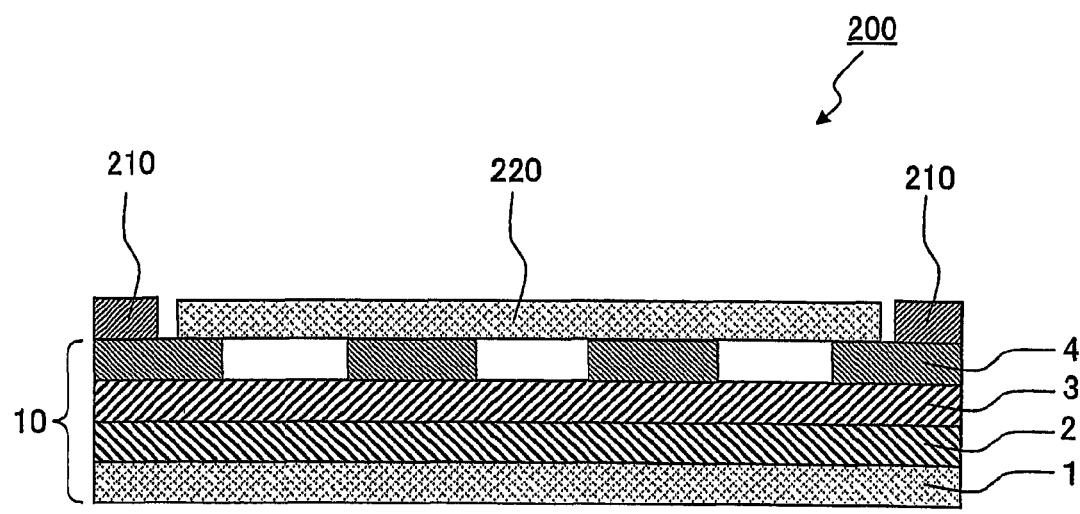
FIG. 11 is a schematic cross-sectional view of a capacitive touch panel according to an eleventh embodiment of the invention.

Next, a description is given of a touch panel according to an eleventh embodiment of the invention. FIG. 11 is a schematic cross-sectional view of a capacitive touch panel according to the eleventh embodiment of the invention. Referring to FIG. 11, the touch panel 200 includes the transparent conductive film 10 described above, electrode terminals 210 arranged at a regular pitch on a peripheral portion of the transparent conductive layer 4 of the transparent conductive film 10, and a transparent protective layer 220 placed above the transparent conductive layer 4 and inside the electrode terminals 210. The transparent protective layer 220 may be made of the same material as the transparent film substrate 1 described above.

In the touch panel 200, the transparent conductive layer 4 is connected through the electrode terminals 210 to a touch location detection circuit (not shown) located on the outside. Therefore, when any point (coordinate) of the transparent protective layer 220 on the transparent conductive layer 4 is touched by a finger, the transparent conductive layer 4 is grounded at the touch point through the capacitance of the human body so that the resistance between each electrode terminal 210 and the ground line is changed. This change is detected by the touch location detection circuit so that the coordinate on the display screen (not shown) is input.

While an example of the touch panel of the invention has been described, the touch panel of the invention is not limited to that according to the embodiment described above, as long as the transparent conductive film of the invention or the transparent conductive laminate of the invention is used. For example, the touch panel of the invention may be of any other detection type such as a resistive film type.

EXAMPLES

Some examples of the invention are described below together with some comparative examples. It will be understood that the invention should not be interpreted as being limited to the examples described below.

Refractive Index of Each Layer

The refractive index of each layer was measured with an Abbe refractometer manufactured by Atago Co., Ltd. according to the measurement method specified for the refractometer, while a measurement light beam was applied to the surface of each object being measured.

Thickness of Each Layer

The thickness of the transparent film substrate was measured with a microgauge type thickness gauge manufactured by Mitutoyo Corporation. The thicknesses of other layers were measured by observing their cross-sections with a transmission electron microscope H-7650 manufactured by Hitachi, Ltd.

Example 1

Formation of First Transparent Dielectric Layer (First Layer)

A first transparent dielectric layer (6 nm in thickness) of a complex oxide (with a refractive index $n1$ of 2.20) containing 100 parts by weight of indium oxide, 3 parts by weight of tin oxide and 44 parts by weight of cerium oxide was formed by a reactive sputtering method under the conditions below in a mixed gas atmosphere of 95% argon gas and 5% oxygen gas from a sintered body of a mixture of 100 parts by weight of indium oxide, 3 parts by weight of tin oxide and 44 parts by weight of cerium oxide on one side of a transparent film substrate (with a refractive index $nf$ of 1.66) made of a 125 μm-thick polyethylene terephthalate film (hereinafter referred to as PET film). Before the mixed gas was introduced into the atmosphere for the film production, gaseous impurities were removed by reducing the degree of vacuum of the atmosphere for the film production to $5.0 \times 10^{-4}$ Pa or less.

Sputtering Conditions

Target Size: 200 mm×500 mm

Power: 3.0 kW

Voltage: 450 V

Discharge Time: 1 minute

Degree of Vacuum: 0.5 Pa

Formation of Second Transparent Dielectric Layer (Second Layer)

$SiO_2$ (with a refractive index $n2$ of 1.46) was then vapor-deposited on the first transparent dielectric layer at a degree of vacuum of $1 \times 10^{-2}$ to $3 \times 10^{-2}$ Pa by an electron-beam heating method to form a 35 nm-thick second transparent dielectric layer.

Formation of Transparent Conductive Layer (Third Layer)

A 22 nm-thick ITO film (with a refractive index $n3$ of 2.00) was formed as a transparent conductive layer on the second transparent dielectric layer by a reactive sputtering method under a mixed gas atmosphere of 98% argon gas and 2% oxygen gas (0.4 Pa) using a sintered material of 97% by weight of indium oxide and 3% by weight of tin oxide.

Patterning of ITO Film by Etching

After a photoresist film having a stripe pattern was formed on the ITO film, the ITO film was etched by immersing it in a 5% by weight hydrochloric acid (aqueous hydrogen chloride solution) at 25° C. for 1 minute. The resulting ITO film had a pattern width of 5 mm and a pattern pitch of 1 mm.

Heat Treatment of Transparent Conductive Layer

The patterned ITO film was heat-treated at 140° C. (for 90 minutes) so that the component of the ITO film was crystallized. As a result, a transparent conductive film was obtained.

Examples 2 to 5

Transparent conductive films each having a patterned ITO film were obtained using the process of Example 1, except that the thickness of each of the first layer (the first transparent dielectric layer) and the second layer (the second transparent dielectric layer) was adjusted to the value shown in Table 1.

Example 6

A transparent conductive film having a patterned ITO film was obtained using the process of Example 1, except that the first transparent dielectric layer was made of a complex oxide (with a refractive index n1 of 2.10) containing 100 parts by weight of indium oxide, 3 parts by weight of tin oxide and 40 parts by weight of cerium oxide.

Example 7

A transparent conductive film having a patterned ITO film was obtained using the process of Example 1, except that the first transparent dielectric layer was made of a complex oxide (with a refractive index n1 of 2.25) containing 100 parts by weight of indium oxide, 3 parts by weight of tin oxide and 50 parts by weight of cerium oxide.

Comparative Example 1

A transparent conductive film having a patterned ITO film was obtained using the process of Example 1, except that the first layer (the first transparent dielectric layer) was formed by the method shown below and that the thickness of the second layer (the second transparent dielectric layer) was adjusted to the value shown in Table 1.

Formation of First Transparent Dielectric Layer of Comparative Example 1

A 150 nm-thick first transparent dielectric layer was formed by a process including applying a thermosetting resin (with a refractive index n1 of 1.54) composed of a melamine resin, an alkyd resin and an organosilane condensate (2:2:1 in weight ratio) to one side of a 125 μm-thick PET film and curing the resin.

Comparative Example 2

A transparent conductive film having a patterned ITO film was obtained using the process of Example 1, except that a 30 nm-thick ITO film was formed as the first layer in place of the first transparent dielectric layer and that the thickness of the second layer (the second transparent dielectric layer) was adjusted to the value shown in Table 1.

Comparative Example 3

A transparent conductive film having a patterned ITO film was obtained using the process of Example 1, except that the thickness of the second layer (the second transparent dielectric layer) was adjusted to the value shown in Table 1.

Comparative Example 4

A transparent conductive film having a patterned ITO film was obtained using the process of Example 1, except that the thickness of the first layer (the first transparent dielectric layer) was adjusted to the value shown in Table 1.

Comparative Example 5

A transparent conductive film having a patterned ITO film was obtained using the process of Example 1, except that the first layer (the first transparent dielectric layer) was formed by the method shown below.

Formation of First Transparent Dielectric Layer of Comparative Example 5

A resin composition was prepared by mixing $TiO_2$ (2.35 in refractive index) fine particles into a thermosetting resin composed of a melamine resin, an alkyd resin and an organosilane condensate (2:2:1 in weight ratio). In this process, the amount of the addition of the $TiO_2$ fine particles was controlled so that the resin composition could have a refractive index n1 of 1.70. The resin composition was applied to one side of a 125 μm-thick PET film and cured to form a 5 nm-thick first transparent dielectric layer.

Comparative Example 6

A transparent conductive film having a patterned ITO film was obtained using the process of Comparative Example 5, except that the thickness of the first layer (the first transparent dielectric layer) was adjusted to the value shown in Table 1.

The transparent conductive films (samples) of the examples and the comparative examples were evaluated as described below. The results are shown in Table 1.

Difference in Reflectance

Reflection spectra were measured at an incidence angle of 10° using a spectrophotometer U-4100 manufactured by Hitachi, Ltd. in a measurement mode with an integrating sphere, and the average reflectance of the pattern portion and the average reflectance of the portion immediately below the pattern opening portion were each calculated in the wavelength range of from 450 to 650 nm. The difference in reflectance between the pattern portion and the portion immediately below the pattern opening portion was calculated from these average reflectance values. A light-blocking layer was formed on the back side (the PET film side) of the transparent conductive film (sample) using a black spray paint, and the measurement was performed under such conditions that reflection from the back side of the sample and incidence of light from the back side were almost prevented.

Light Transmittance

The visible light transmittance was measured at a light wavelength of 550 nm using a spectroscopic analyzer UV-240 manufactured by Shimadzu Corporation.

Evaluation of Appearance

The sample was placed on a black board in such a manner that the transparent conductive layer faced upward, and the sample was visually evaluated. Cases where it was difficult to visually distinguish the pattern portion from the pattern opening portion were evaluated as "◯" (good), and cases where it was possible to visually distinguish the pattern portion from the pattern opening portion were evaluated as "×" (poor).

TABLE 1

| | Composition of layer | | | Thickness of each layer (nm) (The number in parentheses is the optical thickness) | | | Total of the optical thicknesses of the first and second layers (nm) | Difference in reflectance (%) | Transmittance (%) | Evaluation of appearance |
|---|---|---|---|---|---|---|---|---|---|---|
| | First layer (The number in parentheses is the weight ratio) | Second layer | Third layer | First layer | Second layer | Third layer | | | | |
| Example 1 | Indium oxide/tin oxide/cerium oxide (100/3/44) | SiO$_2$ | ITO | 6 (13.2) | 35 (51.1) | 22 (44) | 64.3 | 0.2 | 90.0 | ○ |
| Example 2 | Indium oxide/tin oxide/cerium oxide (100/3/44) | SiO$_2$ | ITO | 7 (15.4) | 35 (51.1) | 22 (44) | 66.5 | 0.4 | 90.0 | ○ |
| Example 3 | Indium oxide/tin oxide/cerium oxide (100/3/44) | SiO$_2$ | ITO | 7 (15.4) | 40 (58.4) | 22 (44) | 73.8 | 0.6 | 90.5 | ○ |
| Example 4 | Indium oxide/tin oxide/cerium oxide (100/3/44) | SiO$_2$ | ITO | 9.5 (20.9) | 30 (43.8) | 22 (44) | 64.7 | 0.8 | 90.0 | ○ |
| Example 5 | Indium oxide/tin oxide/cerium oxide (100/3/44) | SiO$_2$ | ITO | 4 (8.8) | 35 (51.1) | 22 (44) | 59.9 | 0.6 | 90.0 | ○ |
| Example 6 | Indium oxide/tin oxide/cerium oxide (100/3/40) | SiO$_2$ | ITO | 6 (12.6) | 35 (51.1) | 22 (44) | 63.7 | 0.6 | 90.0 | ○ |
| Example 7 | Indium oxide/tin oxide/cerium oxide (100/3/50) | SiO$_2$ | ITO | 6 (13.5) | 35 (51.1) | 22 (44) | 64.6 | 0.5 | 90.0 | ○ |
| Comparative Example 1 | Thermosetting resin | SiO$_2$ | ITO | 150 (231) | 33 (48.2) | 22 (44) | 279.2 | 2.0 | 89.0 | X |
| Comparative Example 2 | ITO | SiO$_2$ | ITO | 30 (60) | 60 (87.6) | 22 (44) | 147.6 | 8.0 | 80.0 | X |
| Comparative Example 3 | Indium oxide/tin oxide/cerium oxide (100/3/44) | SiO$_2$ | ITO | 6 (13.2) | 60 (87.6) | 22 (44) | 100.8 | 2.5 | 90.0 | X |
| Comparative Example 4 | Indium oxide/tin oxide/cerium oxide (100/3/44) | SiO$_2$ | ITO | 12 (26.4) | 35 (51.1) | 22 (44) | 77.5 | 1.5 | 90.0 | X |
| Comparative Example 5 | Thermosetting resin + TiO$_2$ fine particles | SiO$_2$ | ITO | 5 (8.5) | 35 (51.1) | 22 (44) | 59.6 | 1.1 | 90.0 | X |
| Comparative Example 6 | Thermosetting resin + TiO$_2$ fine particles | SiO$_2$ | ITO | 15 (25.5) | 35 (51.1) | 22 (44) | 76.6 | 1.0 | 89.5 | X |

Table 1 shows that the transparent conductive films according to the invention have a good appearance even when the transparent conductive layer is patterned.

What is claimed is:

1. A transparent conductive film, comprising a transparent film substrate, and a first transparent dielectric layer, a second transparent dielectric layer and a transparent conductive layer that are formed on one or both sides of the transparent film substrate in this order from the transparent film substrate, wherein
    the transparent conductive layer is patterned,
    the relation n2<n3<n1 is satisfied, wherein n1 is the refractive index of the first transparent dielectric layer, n2 is the refractive index of the second transparent dielectric layer, and n3 is the refractive index of the transparent conductive layer,
    the first transparent dielectric layer has a thickness of from 2 nm to less than 10 nm,
    the second transparent dielectric layer has a thickness of from 20 nm to 55 nm, and
    the transparent conductive layer has a thickness of from 15 nm to 28 nm.

2. The transparent conductive film of claim 1, wherein
    n1 is from 2.0 to 2.3,
    n2 is from 1.4 to 1.5, and
    n3 is from 1.9 to 2.1.

3. The transparent conductive film of claim 1, wherein
    the transparent conductive layer has a pattern opening portion,
    the first and second transparent dielectric layers have a total optical thickness of from 30 nm to 100 nm immediately below the pattern opening portion, and
    the respective optical thickness of each of the first and second transparent dielectric layers is defined as n (refractive index of the corresponding first or second transparent dielectric layer)×thickness of the corresponding first or second transparent dielectric layer (nm).

4. The transparent conductive film of claim 1, wherein the transparent film substrate has a thickness of from 2 μm to 200 μm.

5. The transparent conductive film of claim 1, wherein the first transparent dielectric layer comprises a complex oxide containing at least indium oxide and cerium oxide.

6. The transparent conductive film of claim 5, wherein the complex oxide further contains tin oxide.

7. The transparent conductive film of claim 5, wherein the complex oxide contains 100 parts by weight of indium oxide, 0 to 20 parts by weight of tin oxide and 10 to 60 parts by weight of cerium oxide.

8. The transparent conductive film of claim 7, wherein the content of cerium oxide in the complex oxide is from more than 40 parts by weight to 60 parts by weight, based on 100 parts by weight of indium oxide.

9. The transparent conductive film of claim 1, wherein the second transparent dielectric layer is made of an inorganic material.

10. The transparent conductive film of claim 9, wherein the inorganic material is $SiO_2$.

11. The transparent conductive film of claim 1, wherein the first transparent dielectric layer is formed by a vacuum deposition method, a sputtering method or an ion plating method.

12. The transparent conductive film of claim 1, wherein
the first transparent dielectric layer, the second transparent dielectric layer and the transparent conductive layer are formed on one side of the transparent film substrate, and
the transparent conductive film further comprises a transparent substrate placed on another side of the transparent film substrate opposite to the first transparent dielectric layer.

13. The transparent conductive film of claim 1, wherein
the first transparent dielectric layer, the second transparent dielectric layer and the transparent conductive layer are formed on both sides of the transparent film substrate in this order from the transparent film substrate, and
the transparent conductive film further comprises a transparent substrate placed on a side of one of the transparent conductive layers opposite to the second transparent dielectric layer.

14. The transparent conductive film of claim 1, wherein the transparent conductive film is for use in a touch panel.

15. The transparent conductive film of claim 14, wherein the touch panel is a capacitive touch panel.

16. The transparent conductive film of claim 1, wherein a difference in reflectance between patterned portions and non-pattern portions of the transparent conductive layer is within a scope of 0.2 to 0.8.

17. A transparent conductive laminate, comprising two or more transparent conductive films laminated with a transparent pressure-sensitive adhesive layer interposed therebetween, wherein
at least one of the transparent conductive films is the transparent conductive film of claim 1, and
the transparent conductive layer of the transparent conductive film of claim 1 is placed on at least one side of the transparent conductive laminate.

18. A touch panel, comprising the transparent conductive film of claim 1.

19. A touch panel, comprising the transparent conductive laminate of claim 17.

* * * * *